(12) United States Patent
Morrett et al.

(10) Patent No.: US 6,329,690 B1
(45) Date of Patent: Dec. 11, 2001

(54) METHOD AND APPARATUS TO MATCH SEMICONDUCTOR DEVICE PERFORMANCE

(75) Inventors: Kent E. Morrett; Edward J. Nowak, both of Essex Junction; Stephen A. St. Onge, Colchester; Josef S. Watts, South Burlington, all of VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/425,393

(22) Filed: Oct. 22, 1999

(51) Int. Cl.[7] .................................................. H01L 27/01
(52) U.S. Cl. .......................... 257/350; 257/347; 257/379; 438/149; 438/479; 438/517
(58) Field of Search ...................... 250/345, 351, 250/338.5; 347/60; 438/109, 149, 479, 152, 155, 156, 309, 517, 311; 257/536, 537, 347, 350, 379

(56) References Cited

U.S. PATENT DOCUMENTS

| | | |
|---|---|---|
| 4,896,199 * | 1/1990 | Tsuzuki et al. |
| 5,049,961 * | 9/1991 | Zommer et al. |
| 5,343,064 | 8/1994 | Spangler et al. |
| 5,345,213 * | 9/1994 | Semancik et al. ............... 338/34 |
| 5,464,966 | 11/1995 | Gaitan et al. |
| 5,817,543 | 10/1998 | McAllister et al. |
| 5,869,354 | 2/1999 | Leedy . |

OTHER PUBLICATIONS

Briand et al., "Novel Low–Power Consumption MOSFET Array Gas Sensor," 10th International Conference on Solid–State Sensors and Actuators, Transducers '99, Digest of Technical Papers,Jun. 7–10, 1999,Inst. of Elec. Engineers of Japan,vol. 2, pp. 938–941.*

* cited by examiner

Primary Examiner—Nathan Flynn
Assistant Examiner—Kevin Quinto
(74) Attorney, Agent, or Firm—Mark Chadurjian, Esq.; McGinn & Gibb, PLLC

(57) ABSTRACT

A semiconductor structure may include a silicon substrate, a first active device formed in a first region of the silicon substrate, a second active device formed in a second region of the silicon substrate, a first heating device connected thermally to the first active device and a second heating device connected thermally to the second active device. A first temperature sensing device detects a temperature of the first region, a second temperature sensing device detects a temperature of the second region and a circuit activates one of the first heating device and the second heating device in response to a sensed difference in temperature from the first and second temperature sensing devices.

19 Claims, 3 Drawing Sheets

METHOD AND APPARATUS TO MATCH SEMICONDUCTOR DEVICE PERFORMANCE

BACKGROUND OF THE INVENTION

1. Field of the Invention

The present invention generally relates to a method and apparatus that maintains devices at the same temperature on a silicon on insulator (SOI) substrate.

2. Description of the Related Art

Conventional systems utilize identical devices (transistors and diodes) in different circuits at different locations on a chip. These devices dissipate different amounts of heat depending upon the duty cycle of the circuit and surrounding circuits and devices. Further, these devices operate at different temperatures. Thus, each device, even if designed identically, may have different current/voltage (IV) characteristics so the circuits will not behave identically, which can result in design flaws.

The temperature effects of NMOS and PMOS devices are well known. For example, the mobility of the carriers is inversely proportional to the temperature. The mobility may decrease (and resistivity may increase) by about 40% for each 100° C. temperature rise. Further, both drain current and threshold voltage decrease with mobility. Accordingly, devices at different temperatures can have very different characteristics.

To minimize these problems, devices that need to be matched are placed in close proximity to each other. However, this is not always possible and therefore cooling may be applied to the chip using external heat sinking. Even this is not completely effective, especially in low voltage regimes. Devices fabricated in silicon on insulator (SOI) technology presents an additional problem because they are thermally isolated by the insulator which makes bulk cooling not as effective.

SUMMARY OF THE INVENTION

In view of the foregoing and other problems of the conventional methods, it is, therefore, an object of the present invention to provide a semiconductor structure that may include a silicon substrate, a first active device formed in a first region of the silicon substrate and a second active device formed in a second region of the silicon substrate. A first heating device (such as a resistor) may be connected thermally to the first active device and a second heating device (such as a resistor) may be connected thermally to the second active device. A first temperature sensing device (such as a diode) may detect a temperature of the first region and a second temperature sensing device (such as a diode) may detect a temperature of the second region. A circuit may activate the first heating device or the second heating device in response to a sensed difference in temperature from the first and second temperature sensing devices. Current may be supplied to the heating devices to activate them.

The structure may also include a first amplifier and a second amplifier. The first amplifier may be connected between the first temperature sensing device and the first heating device. The second amplifier may be connected between the second temperature sensing device and the second heating device. The first heating device may include a first polysilicon resistor formed on the first active device, while the second heating device may comprise a second polysilicon resistor formed on the second active device.

A first load device may also be provided in the first region of the silicon substrate and a second load device may be provided in the second region of the silicon substrate.

The present invention provides a methodology, circuit and structure to keep devices in different locations on the chip at the same temperature by providing a method and apparatus of monitoring the temperature of each device, and maintaining each device at the same temperature by turning a heating device on or off.

Other objects, advantages and salient features of the invention will become apparent from the following detailed description taken in conjunction with the annexed drawings, which disclose preferred embodiments of the invention.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS OF THE INVENTION

Figure 1A:
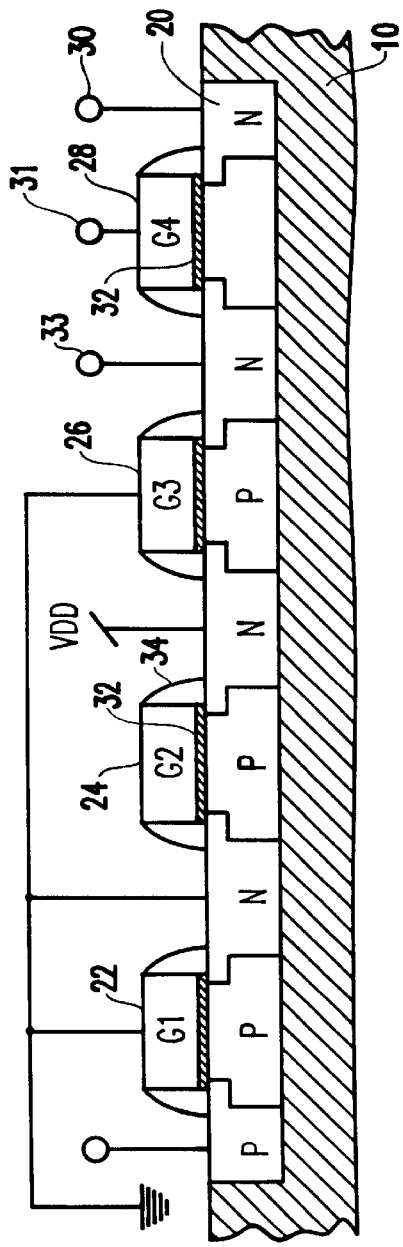
FIG. 1A is a cross-sectional view of a first portion of a chip according to a first embodiment of the present invention.
Figure 1B:
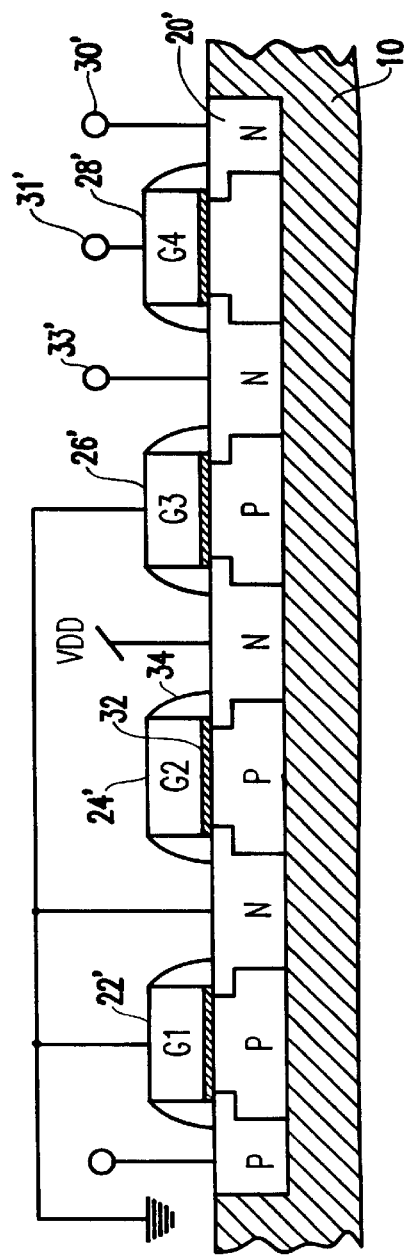
FIG. 1B is a cross-sectional view of a second portion of a chip according to the first embodiment of the present invention.

FIG. 1A shows a cross-sectional view of a first portion of a semiconductor chip while FIG. 1B shows a cross-sectional view of a second portion of a semiconductor chip which is electrically isolated from the first portion of the chip shown in FIG. 1A. The first and second portion may be electrically isolated by a buried oxide layer and a shallow trench isolation region. FIG. 1A shows an insulating layer 10 having a silicon island 20 formed thereon. FIG. 1B shows a silicon island 20' formed on the insulating layer 10. This silicon-on-insulator structure is well known to one skilled in the art.

As shown in the figures, the silicon island 20 may include semiconductor junctions (such as PN junctions). FIG. 1A also shows an active device 28, such as a field effect transistor (FET) comprising a source and drain diffusion formed in the silicon island 20 and a gate oxide and gate formed above the other island. This active device 28 will be temperature matched with an active device 28' as described below. The active device 28 may include a plurality of input/output terminals 30 that receive and output signals. A load device 26 such as a FET similar to the active device 28 is also provided in the silicon island 20. The load device 26 may be connected to a ground potential. A heating element 24, such as a FET or resistor, may also be formed on the silicon island 20. Still further, a temperature sensing device 22, such as a diode, may also be formed on the silicon island 20 to sense a temperature of the silicon island 20. As one skilled in the art would understand, when the temperature of the silicon island 20 increases, the temperature of the diode (i.e., the temperature sensing device 22) likewise increases. This increase in the temperature of the diode causes more current to flow through the diode. For example, when the temperature of the silicon island 20 increases, the diode current also increases. When the temperature of the silicon island 20 decreases, the diode current (i.e., the current through the temperature sensing device 20') decreases. Further, a spacer 34 may also be provided on sides of each of the respective devices as is well known to one skilled in the art.

The silicon island 20' of FIG. 1B is similar to the silicon island 20 shown in FIG. 1 and therefore its description is omitted. Each of the devices in FIG. 1B is numbered 22', 24', 26', 28', and 30' to correspond with a similar device in FIG. 1A.

Figure 2:
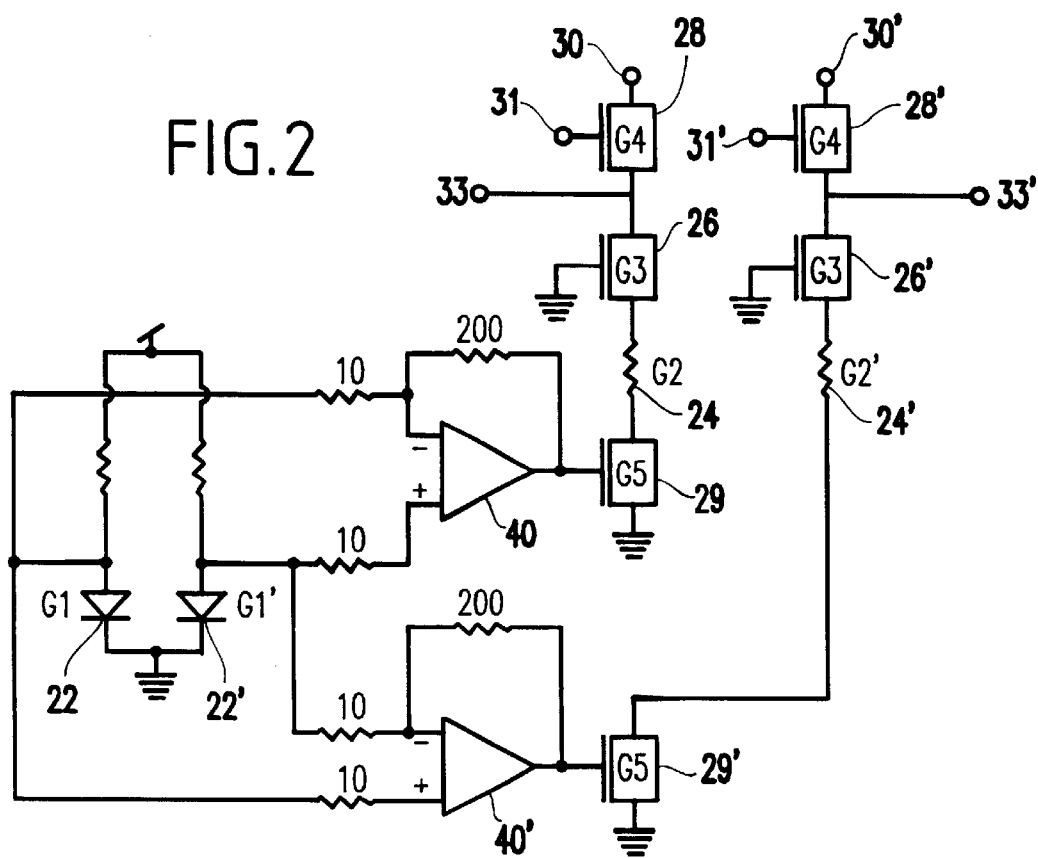
FIG. 2 is a schematic diagram of the circuit of the present invention.

FIG. 2 is a circuit diagram of the present application that is used to keep devices located in different locations at the same temperature. The circuit is designed such that the active devices 28 and 28' are both maintained at the same temperature even though these devices may be located on separate silicon islands 20 and 20', and preferably far apart on the chip. For reference, all the resistances are shown in units of kiloohms.

As shown in FIG. 2, the active element 28 is connected to the load device 26, which is further connected to the heating element 24 such as a FET or resistor.

The temperature sensing devices 22 and 22' sense the temperature of the respective silicon island 20 and 20' and each output a signal to an input terminal of the amplifiers 40 and 40', respectively. The signal from device 22 connects to the positive input terminal of amplifier 40 and the negative input terminal of amplifier 40'. The signal from device 22' connects to the positive input terminal of amplifier 40' and the negative input terminal of amplifier 40.

In operation, if the temperature sensing device 22 and the temperature sensing device 22' both sense the same temperature, and thereby the diode currents are the same, then the positive and negative inputs to the amplifier 40 would be identical and the positive and negative inputs to the amplifier 40' would also be identical. As a result, neither of the heating elements 24 and 24' would be activated by an output signal from the amplifiers 40 and 40'. However, if the temperature sensing devices 22 and 22' sense different temperatures, then an imbalance exists and one of the amplifiers 40 and 40' will output a signal, which in turn supplies power to one of the heating elements 24 and 24'. For example, if temperature sensing device 22 sensed a greater temperature than temperature sensing device 22', then the voltage at the negative input to amplifier 40' would be less than the voltage of the positive input to amplifier 40'. This would cause the output voltage of amplifier 40' to increase and thus activate heating element 24'. Alternatively, if temperature sensing device 22' sensed a greater temperature than temperature sensing device 22, then the voltage at the negative input to amplifier 40 would be less than the voltage at the positive input to amplifier 40. This would cause the output voltage of amplifier 40 to increase and thus activate heating element 24. The supporting devices of the circuit may be provided at locations distant from the silicon islands 20 and 20'.

Figure 3:
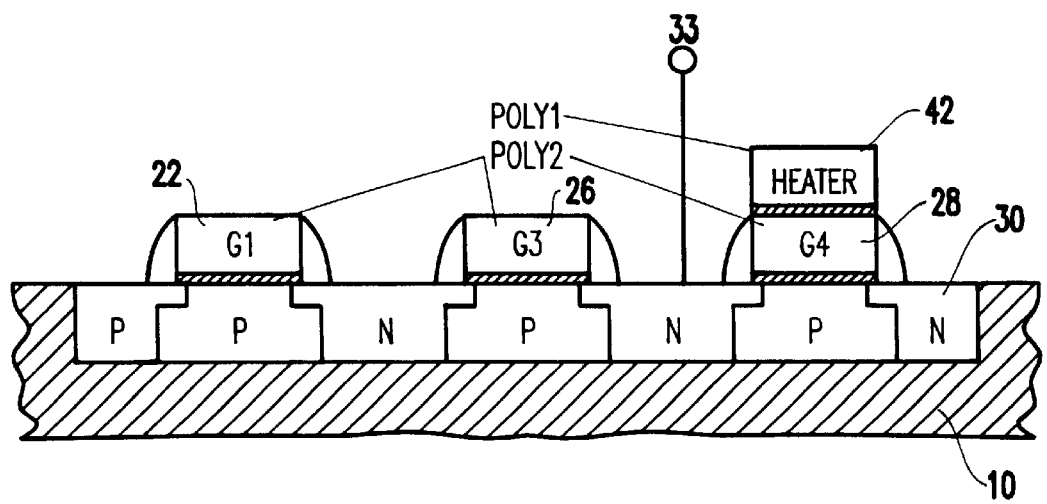
FIG. 3 is a cross-sectional view of a portion of a chip showing a second embodiment of the present invention.

FIG. 3 shows a second embodiment of the present invention. In this embodiment, the active device 28, the load device 26 and the temperature sensing device 22 are provided on the silicon island 30. Although not shown, devices 28', 26' and 22' are similarly provided on another silicon island. In this embodiment, the heating elements 24 and 24' are not provided in the silicon island 30 but rather, the heating element may be replaced with polysilicon resistors 42, 42', which are formed on top of active devices 28, 28' respectively. The polysilicon resistor 42 is located in proximity to the island. An oxide layer may also be provided between the active device 28 and the polysilicon resistor 42.

Figure 4:
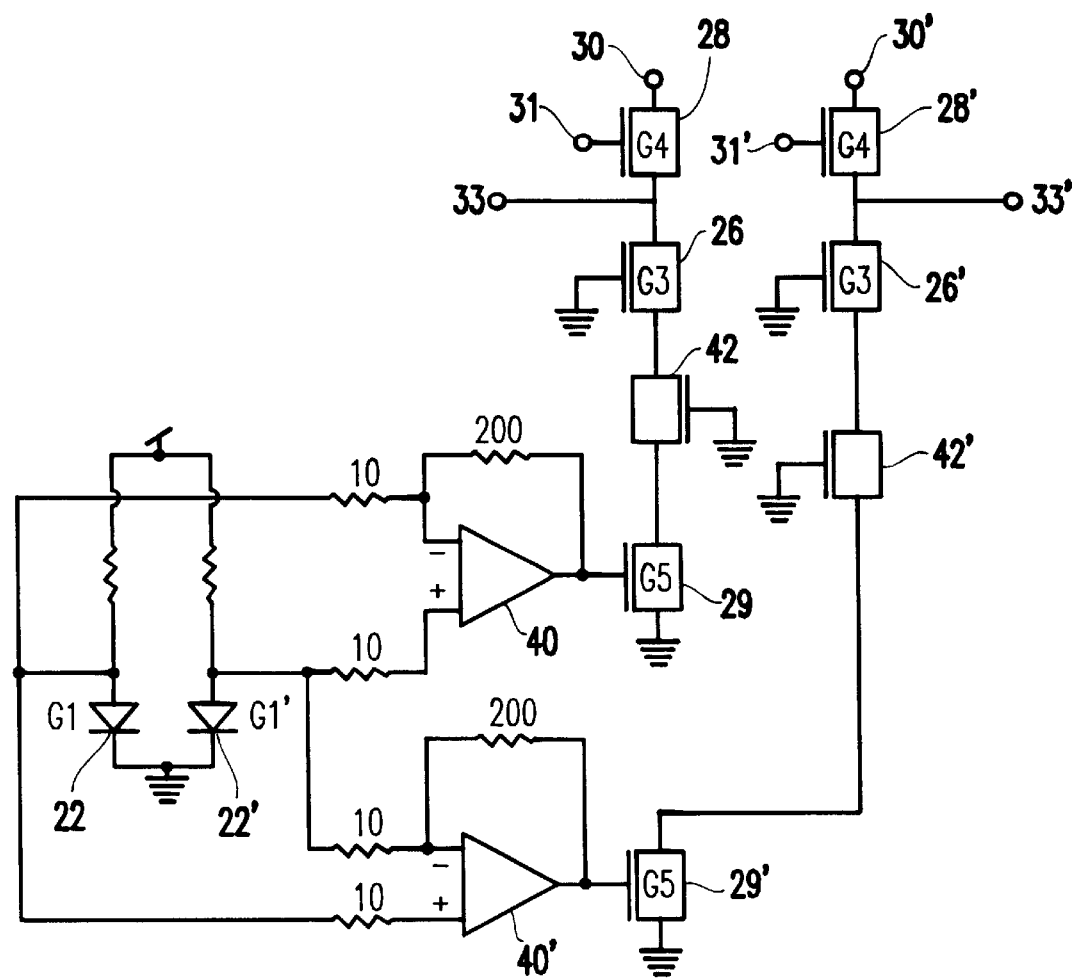
FIG. 4 is a schematic diagram of the circuit of the present invention.

This embodiment saves space in the active circuit by stacking the heating element above the active device rather than in the silicon island. FIG. 4 shows the circuit for the second embodiment. The operation is similar to the first embodiment, except that the addition of support devices 29 and 29' such as an FET is added to control current in the polysilicon resistors 42 and 42'.

The invention described above provides a circuit to keep devices in different locations (i.e., different silicon islands) on the chip at the same temperature. This is provided by monitoring the temperature of each device and maintaining each device at the same temperature by turning a heating device such as a resistor on or off. That is, the circuit shown in FIG. 2 activates one of the heating elements 24 and 24' in response to a sensed difference in temperature from the temperature sensing devices 22 and 22'.

The present invention also provides a silicon-on-insulator structure which includes a first temperature sensing device and a first heating element provided on a first silicon island and a second temperature sensing device and a second heating element provided on a second silicon island. A circuit activates one of the heating devices in response to a sensed difference in temperature.

While the invention has been described with reference to specific embodiments, the description of the specific embodiments is illustrative only and is not to be considered as limiting the scope of the invention. Various other modifications and changes may occur to those skilled in the art without departing from the spirit and scope of the invention.

What is claimed is:

1. A semiconductor structure comprising:
   a silicon substrate;
   a first active device formed in a first region of said silicon substrate;
   a second active device formed in a second region of said silicon substrate;
   a first heating device connected thermally to said first active device and a second heating device connected thermally to said second active device;
   a first temperature sensing device that detects a temperature of said first region;
   a second temperature sensing device that detects a temperature of said second region; and
   a circuit connected to said first and second temperature sensing devices and said first and second heating devices said circuit activating one of said first heating device and said second heating device in response to a sensed difference in temperature from said first temperature sensing device and said second temperature sensing device.

2. The structure of claim 1, wherein said first heating device and said second heating device each comprise one of a resistor and a field effect transistor.

3. The structure of claim 1, wherein said first temperature sensing device and said second temperature sensing device each comprise a diode.

4. The structure of claim 1, wherein said circuit comprises a first amplifier and a second amplifier, said first amplifier being connected between said first temperature sensing device and said first heating device, said second amplifier being connected between said second temperature sensing device and said second heating device.

5. The structure of claim 1, wherein said silicon substrate is formed on an insulator to form a silicon-on-insulator structure.

6. The structure of claim 1, wherein said first active device, said first heating device and said first temperature sensing device are located on a first silicon island of said silicon substrate.

7. The structure of claim 6, wherein said second active device, said second heating device and said second temperature sensing device are located on a second silicon island of said silicon substrate.

8. The structure of claim 1, wherein said first heating device comprises a first polysilicon resistor formed on said first active device and said second heating device comprises a second polysilicon resistor formed on said second active device.

9. The structure of claim 8, further comprising a first oxide layer formed between said first active device and said first polysilicon resistor and a second oxide layer formed between said second active device and said second polysilicon resistor.

10. The structure of claim 1, further comprising a first load device provided in said first region of said silicon substrate and a second load device provided in said second region of said silicon substrate.

11. A method of temperature matching electronic devices on a silicon substrate, the method comprising:
    sensing a temperature in a first region of said silicon substrate by using a first temperature sensing device;
    sensing a temperature in a second region of said silicon substrate by using a second temperature sensing device; and
    activating a heating element in one of said first region and said second region in response to a sensed difference in temperature from said first and second temperature sensing devices.

12. The method of claim 11, wherein said heating element comprises one of a heating element and a resistor.

13. The method of claim 11, wherein said first temperature sensing device and said second temperature sensing device each comprise a diode.

14. The method of claim 11, wherein said sensed difference in temperature is determined using a first amplifier and a second amplifier, and said activating said heating element comprises outputting a signal from one of said first amplifier and said second amplifier to said heating element.

15. The method of claim 11, wherein said activating said heating element comprises supplying current to said heating element.

16. A silicon-on-insulator structure comprising:
    a first silicon island having formed thereon a first temperature sensing device and a first heating element; and
    a second silicon island having formed thereon a second temperature sensing device and a second heating element,
    wherein said first and second temperature sensing devices are electrically coupled to said first and second heating elements so as to make a temperature on said first silicon island equal to a temperature on said second silicon island.

17. The structure of claim 16, further comprising:
    a first active device provided on said first silicon island, wherein said first temperature sensing device senses a temperature of said first silicon island and said first heating element is connected thermally to said first active device to heat said first silicon island.

18. The structure of claim 17, further comprising:
    a second active device provided on said second silicon island, wherein said second temperature sensing device senses a temperature of said second silicon island and said second heating element is connected thermally to said second active device to heat said second silicon island.

19. A silicon-on-insulator structure comprising:
    a first temperature sensing device;
    a first heating element, wherein said first temperature sensing device and said first heating element are provided on a first silicon island of said silicon-on-insulator structure;
    a first active device provided on said first silicon island, wherein said first temperature sensing device senses a temperature of said first silicon island and said first heating element is connected thermally to said first active device to heat said first silicon island;
    a second temperature sensing device provided on a second silicon island of said silicon-on-insulator structure;
    a second heating element provided on said second silicon island;
    a second active device provided on said second silicon island, wherein said second temperature sensing device senses a temperature of said second silicon island and said second heating element is connected thermally to said second active device to heat said second silicon island; and
    a circuit to activate one of said first heating element and said second heating element in response to a sensed difference in temperature from said first temperature sensing device and said second temperature sensing device.

* * * * *